(12) United States Patent
Negishi (10) Patent No.: US 7,135,880 B2
(45) Date of Patent: Nov. 14, 2006

(54) TEST APPARATUS

(75) Inventor: Toshiyuki Negishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 93 days.

(21) Appl. No.: 10/922,587

(22) Filed: Aug. 20, 2004

(65) Prior Publication Data

US 2005/0024036 A1    Feb. 3, 2005

Related U.S. Application Data

(63) Continuation of application No. PCT/JP2004/006460, filed on May 13, 2004.

(30) Foreign Application Priority Data

May 15, 2003   (JP) .............................. 2003-137553

(51) Int. Cl.
*G01R 31/26* (2006.01)
(52) U.S. Cl. .................. 324/765; 324/763; 714/738
(58) Field of Classification Search ............ 324/158.1, 324/763, 765; 714/724–733, 738; 327/100–107; 708/270–273
See application file for complete search history.

(56) References Cited

U.S. PATENT DOCUMENTS

| | | | | |
|---|---|---|---|---|
| 4,806,852 A | * | 2/1989 | Swan et al. ................. | 324/73.1 |
| 5,412,258 A | * | 5/1995 | Ogawa et al. ............... | 327/170 |
| 5,703,515 A | | 12/1997 | Toyama et al. | |
| 6,604,058 B1 | * | 8/2003 | Nakayama .................. | 702/117 |
| 6,907,385 B1 | * | 6/2005 | Yasui ......................... | 702/184 |

FOREIGN PATENT DOCUMENTS

| | | |
|---|---|---|
| JP | 60-194375 | 10/1985 |
| JP | 7-20582 | 11/1995 |
| JP | 11-316260 | 11/1999 |
| JP | 2001-091598 A | 6/2001 |

OTHER PUBLICATIONS

Japanese International Search Report dated May 13, 2004; Appl. No. PCT/JP2004/006460; (2 pages).
Partial translation of English abstract for publication Nos. 11-316260 and 60-194375, Nov. 16, 1999 and Oct. 2, 1985.
Supplementary European Search Report dated Jun. 20, 2006 for EP patent application No. 04732732, which corresponds to PCT/JP2004/006460, from which this application claims priority, 3 pages.
Patent Abstracts of Japan, Publication No. 2001-091598 dated Apr. 6, 2001, 2 pages.

* cited by examiner

*Primary Examiner*—Ernest Karlsen
*Assistant Examiner*—Arleen M. Vazquez
(74) *Attorney, Agent, or Firm*—Osha Liang LLP (57) ABSTRACT

A waveform formatter according to the present invention includes a first delay circuit for delaying a set signal to control the timing of a first change point of a test signal, a second delay circuit for delaying a reset signal to control the timing of a second change point of the test signal changed by the set signal which the first delay circuit delays, a third delay circuit for delaying a set signal to control the timing of a third change point of the test signal, a fourth delay circuit for delaying a reset signal to control the timing of a fourth change point of the test signal changed by the set signal which is delayed by the third delay circuit, a fifth delay circuit for delaying a set signal to control the timing of a first change point of an enable signal of the driver, a sixth delay circuit for delaying a reset signal to control the timing of a second change point of an enable signal with regard to the driver during a predetermined cycle of a cycle reference signal.

4 Claims, 4 Drawing Sheets

TEST APPARATUS

The present invention is a continuation of PCT/JP2004/006460 filed on May 13, 2004 which claims priority from a Japanese Patent Application No. 2003-137553 filed on May 15, 2003, the contents of which are incorporated herein by reference.

FIELD OF THE INVENTION

The present invention relates to a test apparatus. More particularly, the present invention relates to a test apparatus for testing a device under test (DUT). In addition, the present application claims the benefit of, and priority to, Japanese patent application No. 2003-137553 filed on May 15, 2003, the entire contents of which are incorporated herein by reference for all purposes.

RELATED ART

Figure 1:
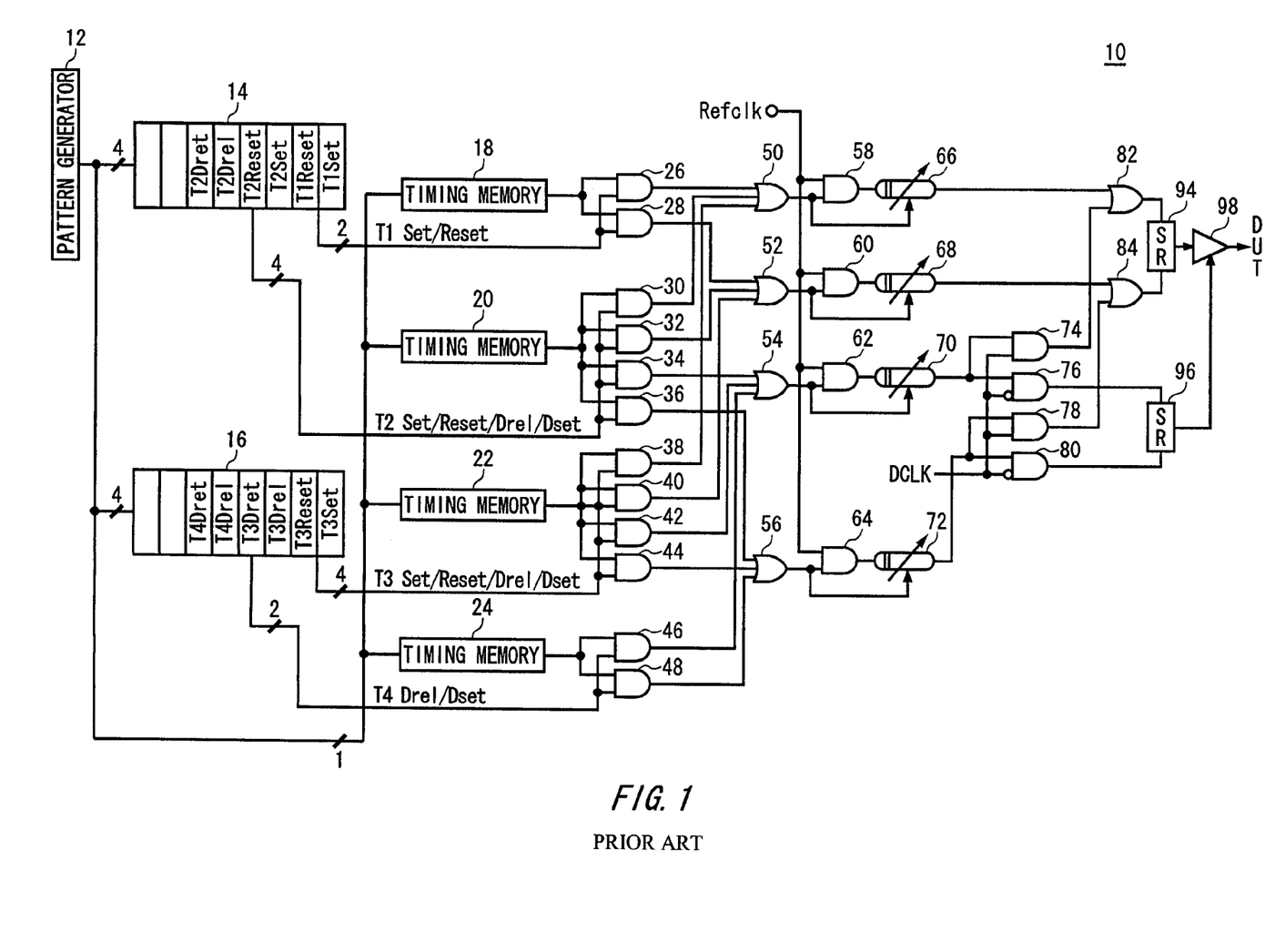
FIG. 1 shows the configuration of a conventional test apparatus 10.

FIG. 1 shows the configuration of a conventional test apparatus 10. A pattern generator 12 generates the pattern data of a test signal to be supplied to a device under test (DUT). Pattern data holding units 14 and 16 store the pattern data generated by the pattern generator 12. In detail, the pattern data holding units 14 and 16 hold the pattern data to determine the input timing, at which a data set or reset signal to control the rise or fall of the test signal to be supplied to the device under test is inputted to a RS latch circuit 94, or at which a driver set or reset signal to control the rise or fall of an enable signal that controls a driver 98 is inputted to a RS latch circuit 96.

Timing memories 18, 20, 22 and 24 hold a timing signal indicating the timing, at which the data set and reset signals and the driver set and reset signals are outputted to the RS latch circuit 94 or 96, and a delay time by which variable delay circuits 66, 68, 70, and 72 are to delay the data set and reset signals and the driver set and reset signals. In addition, the timing memories 18, 20, 22, and 24 obtain from the pattern generator 12 a cycle reference signal to generate the test cycle to be supplied to the device under test.

In detail, the timing memories 18, 20, 22 and 24 hold a first timing signal indicating first timing (T1), a second timing signal indicating second timing (T2), a third timing signal indicating third timing (T3) and a fourth timing signal indicating fourth timing (T4) during a predetermined cycle of a cycle reference signal. Accordingly, the timing memories 18, 20, 22 and 24, according to the cycle reference signal, output the first, second, third and fourth signals, respectively.

AND circuits 26 and 28 perform AND operations on each of the pattern data "T1Set" and "T1Reset", which determines the input timing of the data set and reset signals related to the first timing (T1), respectively, and the first timing signal obtained from the timing memory 18 and output the results. Also, AND circuits 30, 32, 34, and 36 perform AND operations on each of the pattern data "T2Set", "T2Reset", "T2Drel", and "T2Dret", which determines the input timing of the data set and reset signals and the driver set and reset signals related to the second timing (T2), respectively, and the second timing signal obtained from the timing memory 20 and output the results.

AND circuits 38, 40, 42 and 44 perform AND operations on the pattern data "T3Set", "T3Reset", "T3Del", and "T3Dret", which determine the input timing of the data set and reset signals and the driver set and reset signals related to the third timing (T3), respectively, and the third timing signal obtained from the timing memory 22 and output the results. Also, an AND circuit 46 and 48 perform AND operations on the pattern data "T4Drel" and "T4Dret", which determine the input timing of the driver set and reset signals related to the fourth timing (T4) and the fourth timing signal obtained from the timing memory 24 and output the results.

The variable delay circuit 66 obtains the first, second or third timing signal via an OR circuit 50 and an AND circuit 58, and delays and outputs the data set signal based on the obtained timing signal. In addition, the variable delay circuit 68 obtains the first, second or the third timing signal via an OR circuit 52 and an AND circuit 60, and delays and outputs the data reset signal based on the obtained timing signal.

The variable delay circuit 70 obtains the second, third or fourth timing signal via an OR circuit 54 and an AND circuit 62, and delays and outputs the data set signal or the driver set signal based on the obtained timing signal. In addition, the variable delay circuit 72 obtains the second, third or fourth timing signal via an OR circuit 56 and an AND circuit 64, and delays and outputs the data reset signal or the driver reset signal based on the obtained timing signal.

When a DCLK signal is on, the data set signals outputted from the variable delay circuits 66 and 70 are inputted to the RS latch circuit 94 via an AND circuit 74 and an OR circuit 82. In addition, the data reset signal outputted from the variable delay circuit 68 and 72 are inputted to the RS latch circuit 94 via an AND circuit 78 and an OR circuit 84. Therefore, the RS latch circuit 94 can control the set/reset change of the test signal two times during the predetermined cycle of the cycle reference signal by using the data set signal outputted from the variable delay circuit 66, the data reset signal outputted from the variable delay circuit 68, the data set signal outputted from the variable delay circuit 70 and the data reset signal outputted from the variable delay circuit 72. In this case, the RS latch circuit 96 can change the level of the driver reset signal, but cannot control the set/reset change of the enable signal.

When the DCLK signal is off, the data set signal outputted from the variable delay circuit 66 is inputted to the RS latch circuit 94 via an OR circuit 82. Also, the data reset signal outputted from the variable delay circuit 68 is inputted to the RS latch circuit 94 via an OR circuit 84. In addition, the data set signal outputted from the variable delay circuit 70 is inputted to the RS latch circuit 96 via an AND circuit 76. Further, the driver reset signal outputted from the variable delay circuit 72 is inputted to the RS latch circuit 96 via an AND circuit 80. Therefore, the RS latch circuit 94 can control the set/reset change of the test signal once during the predetermined cycle of the cycle reference signal by using the data set signal outputted from the variable delay circuit 66 and the data reset signal outputted from the variable delay circuit 68. Also the RS latch circuit 96 can control the set/reset change of the enable signal once during the predetermined cycle of the cycle reference signal by using the driver set signal outputted from the variable delay circuit 70 and the driver reset signal outputted from the variable delay circuit 72.

Since the existence of the documents in the prior art has not been known yet, the documents will herein not be described.

Accompanying the up-to-date semiconductor device with a higher speed, it is required to increase the speed of the set/reset change or the input/output change of the test signal in the test apparatus for testing the semiconductor device.

However, according to the conventional test apparatus 10, when the DCLK signal is on, it is possible to perform the set/reset change of the test signal twice during one cycle, but not to control the change of the enable signal. In addition, when the DCLK signal is off, it is possible to control the change of the enable signal during one cycle, but not to perform the set/reset change of the test signal once during one cycle.

SUMMARY OF THE INVENTION

Accordingly, it is one of the objects of the present invention to provide a test apparatus, which is capable of overcoming the above drawbacks. The above and other objects can be achieved by combinations described in the independent claims. The dependent claims define further advantageous and exemplary combinations of the present invention.

According to one aspect of the present invention, the test apparatus for testing a device under test includes a pattern generator for generating the pattern data of a test signal supplied to the device under test, a waveform formatter for formatting the test signal indicated by the pattern data which is generated by the pattern generator, and a driver for outputting the test signal formatted by the waveform formatter to the device under test.

The waveform formatter includes a first delay circuit for delaying a set signal which controls the timing of a first change point of the test signal during a predetermined cycle of a cycle reference signal, a second delay circuit for delaying a reset signal which controls the timing of a second change point of the test signal changed by the set signal which is delayed by the first delay circuit, a third delay circuit for delaying the set signal which controls the timing of a third change point of the test signal during the predetermined cycle of the cycle reference signal, a fourth delay circuit for delaying the reset signal which controls the timing of a fourth change point of the test signal changed by the set signal which is delayed by the third delay circuit, a fifth delay circuit for delaying the set signal which control the timing of a first change point of the enable signal for a driver during the predetermined cycle of the cycle reference signal, the sixth delay circuit for delaying the reset signal which controls the timing of the second change point of the enable signal with regard to the driver during the predetermined cycle of the cycle reference signal.

The first and third delay circuits may adjust the delay time, by which the set signal is delayed, based on a period from the time when the pattern generator generates the cycle reference signal based on the pattern data to the time when the driver outputs the test signal. The fifth delay circuit may adjust the delay time by which the set signal is delayed, based on a period from the time when the pattern generator generates the cycle reference signal based on the pattern data to the time when the driver is driven according to the pattern data.

The waveform formatter may include a first timing memory for holding the first timing signal, which indicates the first timing during the predetermined cycle of the cycle reference signal and a first delay time by which the set or reset signal outputted at the first timing is to be delayed, a second timing memory for holding the second timing signal, which indicates the second timing later than the first timing during the predetermined cycle of the cycle reference signal and the second delay time by which the set or reset signal outputted at the second timing is to be delayed, a third timing memory for holding the third timing signal, which indicates the third timing later than the second timing during the predetermined cycle of the cycle reference signal and the third delay time by which the set or reset signal outputted at the third timing is to be delayed, and a fourth timing memory for holding the fourth timing signal, which indicates the fourth timing later than the third timing during the predetermined cycle of the cycle reference signal and the fourth delay time by which the set or reset signal outputted at the fourth timing is to be delayed.

The first delay circuit may delay the set signal by the first or second delay time from the first or second timing, respectively, and output the set signal delayed, after obtaining the first or second timing signal and the first or second delay time from the first or second timing memory, respectively.

The third delay circuit may delay the set signal by the third or fourth delay time from the third or fourth timing and output the set signal delayed, after obtaining the third or fourth timing signal and the third or fourth delay time from the third or fourth timing memory, respectively.

The fifth delay circuit may delay the set signal by the first, second, third or fourth delay time from the first, second, third or fourth timing, respectively, and output the set signal delayed, after obtaining the first, second, third or fourth timing signal and the first, second, third or fourth delay time from the first, second, third or fourth timing memory, respectively.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 2:
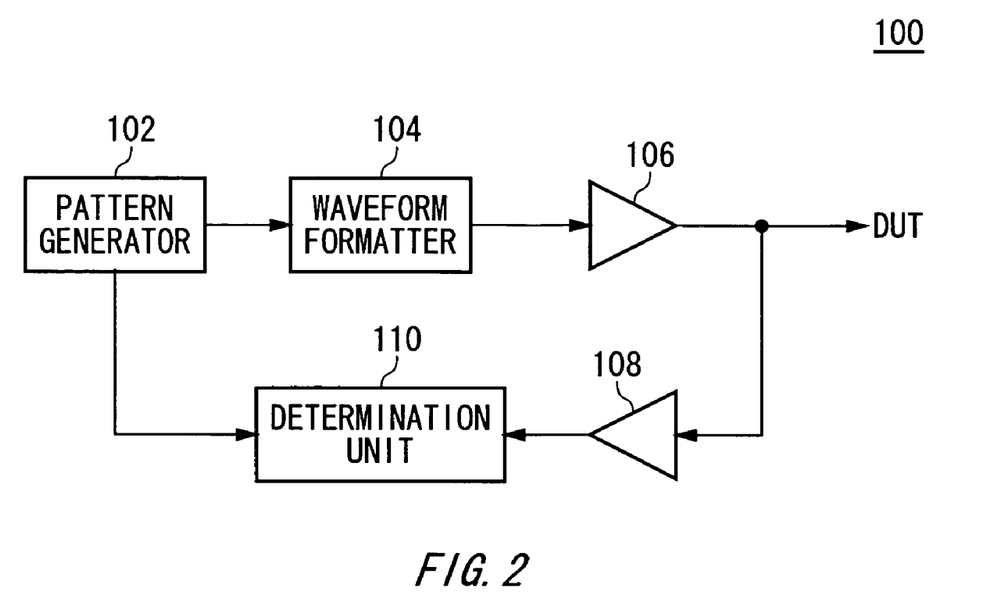
FIG. 2 shows an exemplary configuration of a test apparatus 100 according to an embodiment of the present invention.

FIG. 2 shows an example of the configuration of a test apparatus 100 according to an embodiment of the present invention. The test apparatus 100 includes a pattern generator 102 for generating the pattern data inputted to a device under test (DUT), a waveform formatter 104 for formatting a waveform of a test signal indicated by the pattern data which the pattern generator 102 generates, a driver 106 for outputting the test signal formatted by the waveform formatter 104 to the device under test, a comparator 108 for receiving the test signal outputted from the device under test in response to the test signal outputted from the driver 106, and a determination unit 110 for determining the pass or fail of the device under test by comparing an expected value signal, which is generated by the pattern generator 102 to be read by the device under test, and the test signal outputted from the device under test.

It is an object of the test apparatus 100 related to the embodiment of the present invention to realize the input/output change of the driver 106 and the comparator 108 at a high speed, maintaining the set/reset change of the test signal at a high speed, so as to, for example, test a high speed communication device, etc. requiring the input/output change at 750 Mbps.

Figure 3:
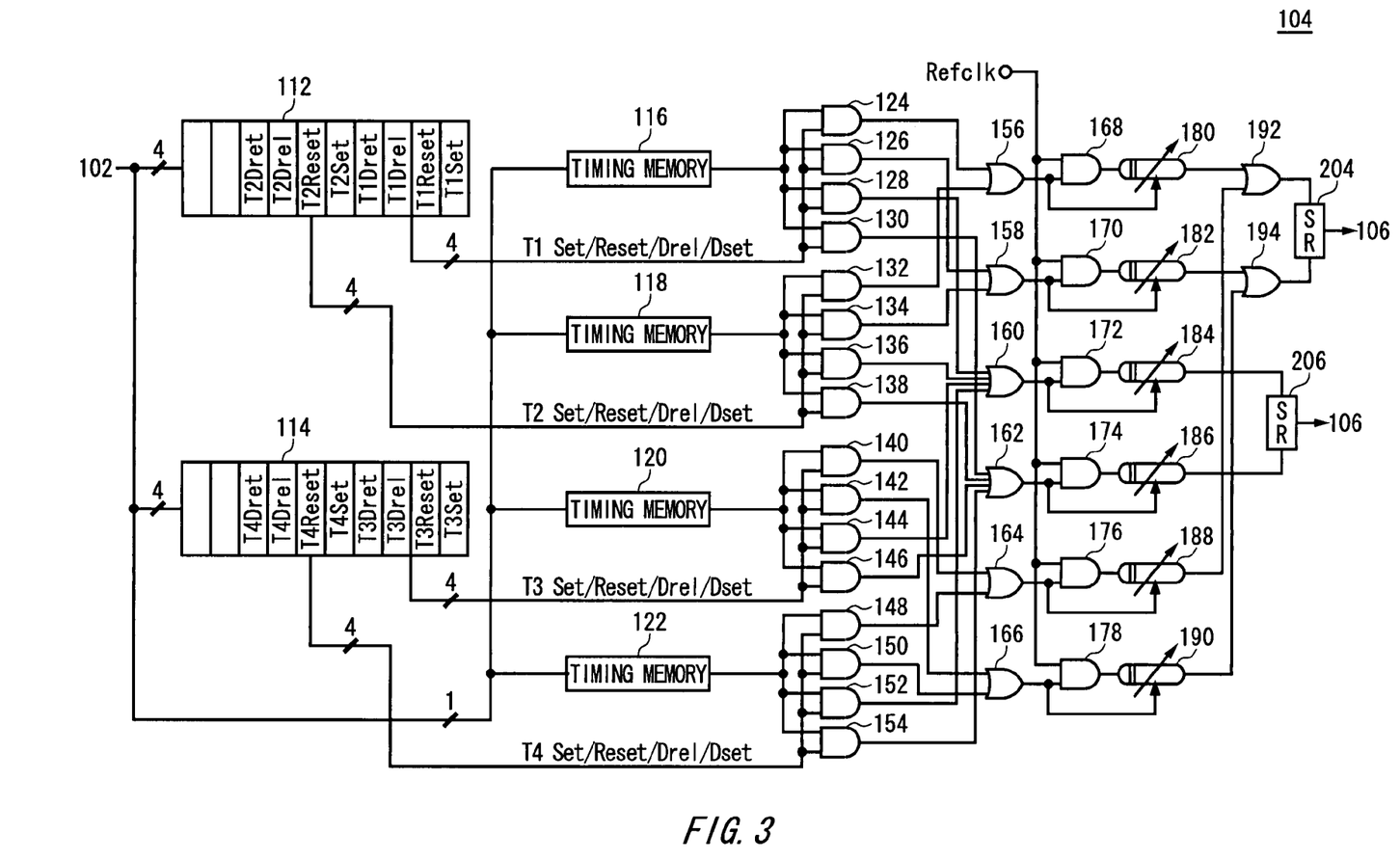
FIG. 3 shows an exemplary configuration of a waveform formatter 104 according to an embodiment of the present invention.

FIG. 3 shows an example of the configuration of the waveform formatter 104 according to an embodiment of the present invention. The waveform formatter 104 includes a pattern holding unit 112, timing memories 116, 118, 120, and 122, AND circuits 124, 126, 128, 130, 132, 134, 136, 138, 140, 142, 144, 146, 148, 150, 152, 154, 168, 170, 172, 174, 176, and 178, OR circuits 156, 158, 160, 162, 164, 166, 192, and 194, variable delay circuits 180, 182, 184, 186, 188, and 190, and RS latch circuits 204 and 206.

The variable delay circuits 180, 182, 184, 186, 188 and 190 are examples of the first, second, fifth, sixth, third and fourth delay circuits of the present invention, respectively. In addition, according to this embodiment of the present invention, the rise or fall of the test signal is an example of a change point of the test signal of the present invention and the rise or fall of an enable signal is an example of a change point of the enable signal of the present invention.

The pattern data holding units 112 and 114 hold the pattern data generated by the pattern generator 102. In detail, the pattern data holding unit 112 holds the pattern data to determine the input timing at which a data set signal to control the timing of the rise of the test signal is inputted to the RS latch circuit 204, a data reset signal to control the timing of the fall of the test signal in the RS latch circuit 204 is inputted to the RS latch circuit 204, a driver set signal to control the timing of the rise of the enable signal of driver 106 is inputted to the RS latch circuit 206, and a driver reset signal to control the timing of the fall of the enable signal of the driver 106 is inputted to the RS latch circuit 206.

For example, during a predetermined cycle of a cycle reference signal generated by the pattern generator 102, the pattern data holding unit 112 holds "T1Set" indicating whether or not the data set signal is outputted to the RS latch circuit 204 at the first timing (T1), "T1Reset" indicating whether or not the data reset signal is outputted to the RS latch circuit 204 at the first timing (T1), "T1Del" indicating whether or not the driver set signal is outputted to the RS latch circuit 206 at the first timing (T1), "T1Dret" indicating whether or not the driver reset signal is outputted to the RS latch circuit 206 at the first timing (T1), "T2Set" indicating whether or not the data set signal is outputted to the RS latch circuit 204 at the second timing (T2) later than the first timing (T1), "T2Reset" indicating whether or not the data reset signal is outputted to the RS latch circuit 204 at the second timing (T2), "T2Del" indicating whether or not the driver set signal is outputted to the RS latch circuit 206 at the second timing (T2), and "T2Dret" indicating whether or not the driver reset signal is outputted to the RS latch circuit 206 at the second timing (T2).

And the pattern data holding unit 112 inputs the pattern data, which determines the input timing of the data set and reset signals and the driver set and reset signals related to the first timing (T1), to the AND circuits 124, 126, 128, and 130, respectively. Also, the pattern data holding unit 112 inputs the data set and reset signals and the driver set and reset signals related to the second timing (T2) to the AND circuits 132, 134, 136, and 138, respectively.

In the same way, the pattern data holding unit 114 holds "T3Set" indicating whether or not the data set signal is outputted to the RS latch circuit 204 at the third timing (T3) later than the second timing (T2), "T3Reset" indicating whether or not the data reset signal is outputted to the RS latch circuit 204 at the third timing (T3), "T3Del" indicating whether or not the driver set signal is outputted to the RS latch circuit 206 at the third timing (T3), "T3Dret" indicating whether or not the driver reset signal is outputted to the RS latch circuit 206 at the fourth timing (T4) later than the third timing (T3), "T4Set" indicating whether or not the data set signal is outputted to the RS latch circuit 204 at the fourth timing (T4), "T4Reset" indicating whether or not the data reset signal is outputted to the RS latch circuit 204 at the fourth timing (T4), "T4Del" indicating whether or not the driver set signal is outputted to the RS latch circuit 206 at the fourth timing (T4), and "T4Dret" indicating whether or not the driver reset signal is outputted to the RS latch circuit 206 at the fourth timing (T4).

Accordingly, the pattern data holding unit 114 inputs the pattern data which determines the input timing of the data set and reset signals and the driver set and reset signals related to the third timing (T3), to the AND circuits 140, 142, 144, and 146, respectively. Also, the pattern data holding unit 114 inputs the pattern data, which determines the input timing of the data set and reset signals and the driver set and reset signals related to the fourth timing (T4), to the AND circuits 148, 150, 152, and 154, respectively.

The timing memories 116, 118, 120 and 122 hold the timing signal that indicates the timing, at which the data set and reset signals and the driver set and reset signals are outputted to the RS latch circuit 204 or 206, and the delay time by which the variable delay circuits 180, 182, 184, 186, 188, and 190 are to delay the data set and reset signals and the driver set and reset signals. In addition, the timing memories 116, 118, 120, and 122 obtain from the pattern generator 102 the cycle reference signal to generate the cycle of the test signal supplied to the device under test.

In detail, the timing memory 116 holds the first timing signal, which indicates the first timing (T1) during the predetermined cycle of the cycle reference signal, and the delay time by which the data set or reset signal and the driver set or reset signal outputted at the first timing (T1) are to be delayed. Therefore, the timing memory 116 outputs the first timing signal, which indicates the first timing (T1) during the predetermined cycle and the first delay time, according to the cycle of the cycle reference signal and inputs them to the AND circuits 124, 126, 128, and 130.

In the same way, the timing memory 118 holds the second timing signal, which indicates the second timing (T2) during the predetermined cycle of the cycle reference signal, and the second delay time by which the data set or reset signal and the driver set or reset signal outputted at the second timing (T2) are to be delayed. Therefore, the timing memory 118 outputs the second timing signal, which indicates the second timing (T2) during the predetermined cycle and the second delay time, according to the cycle of the cycle reference signal and inputs them to the AND circuits 132, 134, 136, and 138.

In the same way, the timing memory 120 holds the third timing signal, which indicates the third timing (T3) during the predetermined cycle of the cycle reference signal, and the third delay time by which the data set or reset signal and the driver set or reset signal outputted at the third timing (T3) are to be delayed. Therefore, the timing memory 120 outputs the third timing signal, which indicates the third timing (T3) during the predetermined cycle and the third delay time, according to the cycle of the cycle reference signal and inputs them to the AND circuits 140, 142, 144, and 146.

In the same way, the timing memory 122 holds the fourth timing signal, which indicates the fourth timing (T4) during the predetermined cycle of the cycle reference signal, and the fourth delay time by which the data set or reset signal, the driver set or reset signal outputted at the fourth timing (T4) are to be delayed. Therefore, the timing memory 122 outputs the fourth timing signal, which indicates the fourth timing (T4) during the predetermined cycle and the fourth delay time, according to the cycle of the cycle reference signal and inputs them to the AND circuits 148, 150, 152, and 154.

The AND circuits 124, 126, 128, and 130 perform AND operations on each of the pattern data "T1Set", "T1Reset", "T1Del", and "T1Dret", which determines the input timing of the data set and reset signals and the driver set and reset signals related to the first timing (T1), and the first timing signal obtained from the timing memory 116, so that they output the results to the OR circuits 156, 158, 160, and 162, respectively. Accordingly, the AND circuits 124, 126, 128, and 130 select and output at least one signal among the data set and reset signals and the driver set and reset signals to be supplied to the RS latch circuit 204 or 206 at the first timing, based on the pattern data obtained from the pattern data holding unit 112.

The AND circuit 132, 134, 136, and 138 perform AND operations on each of the pattern data "T2Set", "T2Reset", "T2Del", and "T2Dret", which determines the input timing of the data set and reset signals and the driver set and reset signals related to the second timing (T2), and the second timing signal obtained from the timing memory 118, so that they output the results to the OR circuits 156, 158, 160, and 162, respectively. Accordingly, the AND circuits 132, 134, 136, and 138 select and output signals among the data set and reset signals and the driver set and reset signals to be supplied to the RS latch circuit 204 or 206 at the second timing, based on the pattern data obtained from the pattern data holding unit 112.

The AND circuits 140, 142, 144, and 146 perform AND operations on each of the pattern data "T3Set", "T3Reset", "T3Del", and "T3Dret", which determines the input timing of the data set and reset signals and the driver set and reset signals related to the third timing (T3), and the third timing signal obtained from the timing memory 120, so that they output the results to the OR circuits 164, 166, 160, and 162, respectively. Accordingly, the AND circuits 140, 142, 144, and 146 select and output signals among the data set and reset signals and the driver set and reset signals to be supplied to the RS latch circuit 204 or 206 at the third timing, based on the pattern data obtained from the pattern data holding unit 114.

The AND circuits 148, 150, 152, and 154 perform AND operations on each of the pattern data "T4Set", "T4Reset", "T4Del", and "T4Dret", which determines the input timing of the data set and reset signals and the driver set and reset signals related to the fourth timing (T4), and the fourth timing signal obtained from the timing memory 122, so that they output the results to the OR circuits 164, 166, 160, and 162, respectively. Accordingly, the AND circuits 148, 150, 152, and 154 select and output signals among the data set and reset signals and the driver set and reset signals to be supplied to the RS latch circuit 204 or 206 at the fourth timing, based on the pattern data obtained from the pattern data holding unit 114.

The OR circuit 156 performs an OR operation on the output signals of the AND circuits 124 and 132, so that it outputs the first or second timing signal to the AND circuit 168. Accordingly, the OR circuit 156 extracts either the first or second timing (T1) or (T2) as the timing at which the data set signal is outputted to the RS latch circuit 204.

The OR circuit 158 performs an OR operation on the output signals of the AND circuits 126 and 134, so that it outputs the first or second timing signal to the AND circuit 170. Accordingly, the OR circuit 158 extracts either the first or second timing (T1 or T2) as the timing at which the data reset signal is outputted to the RS latch circuit 204.

The OR circuit 160 performs an OR operation on the output signals of the AND circuits 128, 136, 144, and 152, so that it outputs the first, second, third or fourth timing signal to the AND circuit 172. Accordingly, the OR circuit 160 extracts one of the first, second, third, and fourth timings (T1, T2, T3 and T4) as the timing at which the driver set signal is outputted to the RS latch circuit 206.

The OR circuit 162 performs an OR operation on output signals of the AND circuits 130, 138, 146, and 154, so that it outputs the first, second, third, or fourth timing signal to the AND circuit 174. Accordingly, the OR circuit 162 extracts one of the first, second, third, and fourth timings (T1, T2, T3 and T4) as the timing at which the driver reset signal is outputted to the RS latch circuit 206.

The OR circuit 164 performs an OR operation on output signals of the AND circuits 140 and 148, so that it outputs the third, or fourth timing signal to the AND circuit 176. Accordingly, the OR circuit 164 extracts either the third or fourth timing (T3 or T4) as the timing at which the data set signal is outputted to the RS latch circuit 204.

The OR circuit 166 performs an OR operation on the output signals of the AND circuits 142 and 150, so that it outputs the third, or fourth timing signal to the AND circuit 178. Accordingly, the OR circuit 166 extracts either the third or fourth timing (T3 or T4) as the timing at which the data reset signal is outputted to the RS latch circuit 204.

The AND circuits 168, 170, 172, 174, 176, and 178 perform AND operations on the respective output signals of the OR circuits 156, 158, 160, 164, and 166 with the reference clock, so that they output the operation results to the delay circuit 180, 182, 184, 186, 188, and 190 according to the timing of the output signals of the OR circuits 156, 158, 160, 162, 164, and 166.

The variable delay circuit 180 delays the data set signal to control the rise timing of the test signal during the predetermined cycle of the cycle reference signal. In detail, the variable delay circuit 180 obtains the first timing signal from the AND circuit 168 and the first delay time held by the timing memory 116, and then delays the data set signal by the first delay time from the first timing (T1), and outputs it to the OR circuit 192. Also, the variable delay circuit 180 obtains the second timing signal from the AND circuit 168 and the second delay time held by the timing memory 118, and delays the data set signal by the second delay time from the second timing (T2), and then outputs it to the OR circuit 192. Further, the variable delay circuit 180 adjusts the first or second delay time by means of the calibration data based on the period from the time when the pattern generator 102 generates the cycle reference signal based on the pattern data to the time when the driver 106 outputs the test signal.

The variable delay circuit 182 delays the data reset signal to control the fall timing of the test signal having risen due to the data set signal delayed by the variable delay circuit 180. In detail, the variable delay circuit 182 obtains the first timing signal from the AND circuit 170 and the first delay time held by the timing memory 116, and then delays the data reset signal by the first delay time from the first timing (T1), and outputs it to the OR circuit 194. Also, the variable delay circuit 182 obtains the second timing signal from the AND circuit 170 and the second delay time held by the timing memory 118, and then delays the data reset signal by the second delay time from the second timing (T2), and outputs it to the OR circuit 194. Accordingly, the variable delay circuit 182 adjusts the first or second delay time by means of the calibration data based on the period from the time when the pattern generator 102 generates the cycle reference signal based on the pattern data to the time when the driver 106 outputs the test signal.

The variable delay circuit 184 delays the driver set signal to control the rise timing of the enable signal with regard to the driver 106 during the predetermined cycle of the cycle reference signal. In detail, the variable delay circuit 184 obtains the first timing signal from the AND circuit 172 and the first delay time held by the timing memory 116, and then delays the driver set signal by the first delay time from the first timing (T1), and outputs it to the RS latch circuit 206. Also, the variable delay circuit 184 obtains the second timing signal from the AND circuit 172 and the second delay time held by the timing memory 118, and then delays the driver set signal by the second delay time from the second timing (T2), and outputs it to the RS latch circuit 206. In addition, the variable delay circuit 184 obtains the third timing signal from the AND circuit 172 and the third delay time held by the timing memory 120, and then delays the driver set signal by the third delay time from the third timing (T3), and outputs it to the RS latch circuit 206. Accordingly, the variable delay circuit 184 obtains the fourth timing signal from the AND circuit 172 and the fourth delay time held by the timing memory 122, and then delays the driver set signal by the fourth delay time from the fourth timing (T4), and outputs it to the RS latch circuit 206. Accordingly, the variable delay circuit 184 adjusts the first, second, third, and fourth delay times by means of the calibration data based on the period from the time when the pattern generator 102 generates the cycle reference signal based on the pattern data to the time when the driver 106 is driven according to the pattern data.

The variable delay circuit 186 delays the driver reset signal to control the fall timing of the enable signal with regard to the driver 106 during the predetermined cycle of the cycle reference signal. In detail, the variable delay circuit 186 obtains the first timing signal from the AND circuit 174 and the first delay time held by the timing memory 116, and then delays the driver reset signal by the first delay time from the first timing (T1), and outputs it to the RS latch circuit 206. Also, the variable delay circuit 186 obtains the second timing signal from the AND circuit 174 and the second delay time held by the timing memory 118, and then delays the driver reset signal by the second delay time from the second timing (T2), and outputs it to the RS latch circuit 206. In addition, the variable delay circuit 186 obtains the third timing signal from the AND circuit 174 and the third delay time held by the timing memory 120, and then delays the driver reset signal by the third delay time from the third timing (T3), and outputs it to the RS latch circuit 206. Accordingly, the variable delay circuit 186 obtains the fourth timing signal from the AND circuit 174 and the fourth delay time held by the timing memory 122, and then delays the driver reset signal by the fourth delay time from the fourth timing (T4), and outputs it to the RS latch circuit 206. Accordingly, the variable delay circuit 186 adjusts the first, second, third, and fourth delay times by means of the calibration data based on the period from the time when the pattern generator 102 generates the cycle reference signal based on the pattern data to the time when the driver 106 is driven according to the pattern data.

The variable delay circuit 188 delays the data set signal to control the rise timing of the test signal during the predetermined cycle of the cycle reference signal. In detail, the variable delay circuit 188 obtains the third timing signal from the AND circuit 176 and the third delay time held by the timing memory 120, and then delays the data set signal by the third delay time from the third timing (T3), and outputs it to the OR circuit 192. Also, the variable delay circuit 188 obtains the fourth timing signal from the AND circuit 176 and the fourth delay time held by the timing memory 122, and then delays the data set signal by the fourth delay time from the fourth timing (T4), and outputs it to the OR circuit 192. Accordingly, the variable delay circuit 188 adjusts the third or fourth delay time by means of the calibration data based on the period from the time when the pattern generator 102 generates the cycle reference signal based on the pattern data to the time when the driver 106 outputs the test signal.

The variable delay circuit 190 delays the data reset signal to control the fall timing of the test signal having risen due to the data set signal delayed by the variable delay circuit 188. In detail, the variable delay circuit 190 obtains the third timing signal from the AND circuit 178 and the third delay time held by the timing memory 120, and then delays the data reset signal by the third delay time from the third timing (T3), and outputs it to the OR circuit 194. Also, the variable delay circuit 190 obtains the fourth timing signal from the AND circuit 178 and the fourth delay time held by the timing memory 122, and then delays the data reset signal by the fourth delay time from the fourth timing (T4), and outputs it to the OR circuit 194. Accordingly, the variable delay circuit 190 adjusts the third or fourth delay time by means of the calibration data based on a period from the time when the pattern generator 102 generates the cycle reference signal based on the pattern data to the time when the driver 106 outputs the test signal.

The OR circuit 192 performs OR operation on the data set signals outputted from the variable delay circuits 180 and 188, and outputs the result to the RS latch circuit 204. Also, the OR circuit 194 performs an OR operation on the data reset signal outputted from the variable delay circuit 182 and 190, and outputs the result to the RS latch circuit 204.

The RS latch circuit 204 generates the test signal based on the data set signal inputted from the OR circuit 192 and the data reset signal inputted from the OR circuit 194, and supplies it to the driver 106. Accordingly, the RS latch circuit 204 sets the test signal by using at least either the first or third timing (T1 or T3) and sets the test signal by using at least either the second or fourth timing (T2 or T4) during the predetermined cycle of the cycle reference signal.

The RS latch circuit 206 generates the enable signal based on the driver set signal inputted from the variable delay circuit 184 and the driver reset signal inputted from the variable delay circuit 186, and supplies it to the driver 106. Accordingly, the RS latch circuit 206 sets or resets the test signal by using at least one of the first, second, third, and fourth timing (T1, T2, T3 and T4) during the predetermined cycle of the cycle reference signal.

In another example, the set/reset change at a high speed may be realized by the test apparatus 100 including more than five timing memories holding different timing signals, respectively, and more than seven variable delay circuits.

Figure 4A:
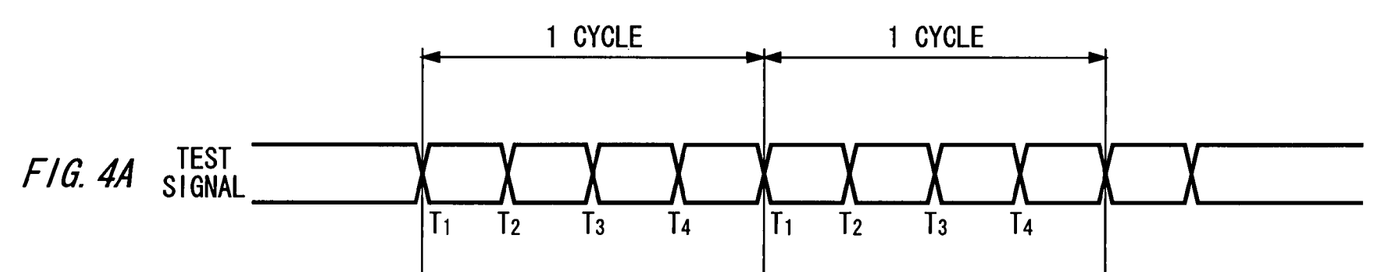
FIGS. 4A and 4B show timing charts of a test signal and enable signal, respectively, according to an embodiment of the present invention.
Figure 4B:
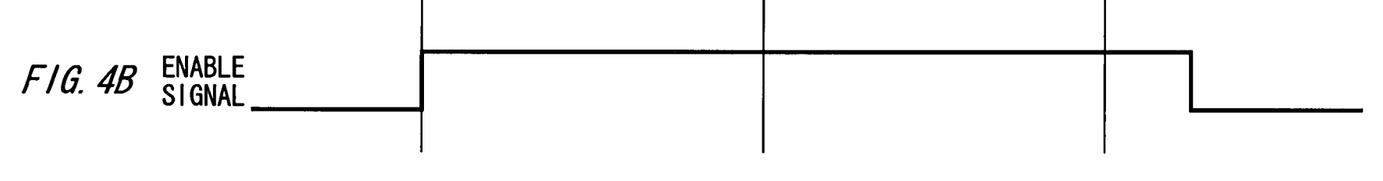

FIGS. 4A and 4B show timing charts of the test and enable signals, respectively, according to an embodiment of the present invention. FIG. 4A shows the test signal that the driver 106 outputs to the device under test. FIG. 4B shows the enable signal with regard to the driver 106.

In the waveform formatter 104 according to an embodiment of the present invention, it is possible to set or reset the test signal by controlling the test signal using four variable delay circuits 180, 182, 188, and 190 at the first, second, third, and fourth timings (T1, T2, T3 and T4). In addition, it is possible to set or reset the test and enable signals at the above timing by controlling the enable signal using the two variable delay circuits 184 and 186. For that reason, it is possible to perform the test of a high speed communication device by realizing the highly speedy input/output changes of the driver 106 and the comparator 108, maintaining the highly speedy set/reset change of the test signal.

Although the present invention has been described by way of exemplary embodiments, it should be understood that those skilled in the art might make many changes and substitutions without departing from the spirit and the scope of the present invention, which is defined only by the appended claims.

As obvious from the description above, according to the present invention, it is possible to perform the highly speedy set/reset change of the test signal and the highly speedy input/output changes of the driver and the comparator.

What is claimed is:

1. A test apparatus for testing a device under test (DUT), comprising:
   a pattern generator for generating a pattern data of a test signal supplied to said device under test;
   a waveform formatter for formatting said test signal indicated by said pattern data; and
   a driver for outputting said test signal formatted by said waveform formatter to said device under test,
   wherein said waveform formatter comprises:
   a first delay circuit for delaying a set signal to control timing of a first change point of said test signal during a predetermined cycle of a cycle reference signal;
   a second delay circuit for delaying a reset signal to control timing of a second change point of said test signal changed by the set signal delayed by said first delay circuit;
   a third delay circuit for delaying a set signal to control timing of a third change point of said test signal during said predetermined cycle of said cycle reference signal;
   a fourth delay circuit for delaying a reset signal to control timing of a fourth change point of said test signal changed by the set signal delayed by said third delay circuit;
   a fifth delay circuit for delaying a set signal to control timing of a first change point of an enable signal with regard to said driver during said predetermined cycle of said cycle reference signal; and
   a sixth delay circuit for delaying a reset signal to control timing of a second change point of said enable signal for said driver during said predetermined cycle of said cycle reference signal.

2. A test apparatus as claimed in claim 1, wherein said first and third delay circuits adjust a delay time, by which said set signal is to be delayed, based on a period from the time when said pattern generator generates said cycle reference signal based on said pattern data to the time when said driver outputs said test signal, and said fifth delay circuit adjusts a delay time, by which said set signal is to be delayed, based on a period from the time when said pattern generator generates said cycle reference signal based on said pattern data to the time when said driver is driven according to said pattern data.

3. A test apparatus as claimed in claim 1, wherein said waveform formatter further comprises:
   a first timing memory for holding a first timing signal, which indicates a first timing during said predetermined cycle of said cycle reference signal, and a first delay time by which said set or reset signal outputted at said first timing is to be delayed;
   a second timing memory for holding a second timing signal, which indicates a second timing later than said first timing during said predetermined cycle of said cycle reference signal, and a second delay time by which said set or reset signal outputted at said second timing is to be delayed;
   a third timing memory for holding a third timing signal, which indicates a third timing later than said second timing during said predetermined cycle of said cycle reference signal, and a third delay time by which said set or reset signal outputted at said third timing is to be delayed; and
   a fourth timing memory for holding a fourth timing signal, which indicates a fourth timing later than said third timing during said predetermined cycle of said cycle reference signal, and a fourth delay time by which said set or reset signal outputted at said fourth timing is to be delayed, said first delay circuit delays said set signal by said first or second delay time from said first or second timing, respectively, and outputs said set signal delayed, after obtaining said first or second timing signal and said first or second delay time from said first or second timing memory, respectively, and said third delay circuit delays said set signal by said third or fourth delay time from said third or fourth timing, respectively, and outputs said set signal delayed, after obtaining said third or fourth timing signal and said third or fourth delay time from said third or fourth timing memory, respectively.

4. A test apparatus as claimed in claim 3, wherein said fifth delay circuit delays said set signal by said first, second, third or fourth delay time from said first, second, third or fourth timing, respectively, and outputs said set signal delayed, after obtaining said first, second, third or fourth timing signal and said first, second, third or fourth delay time from said first, second, third or fourth timing memory, respectively.

* * * * *